United States Patent
Kim et al.

(10) Patent No.: US 8,416,638 B2
(45) Date of Patent: Apr. 9, 2013

(54) SEMICONDUCTOR MEMORY DEVICE REMOVING PARASITIC COUPLING CAPACITANCE BETWEEN WORD LINES

(75) Inventors: Dong Hwee Kim, Icheon (KR); Jin Hong An, Gyeonggi-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 274 days.

(21) Appl. No.: 12/164,216

(22) Filed: Jun. 30, 2008

(65) Prior Publication Data

US 2009/0238024 A1    Sep. 24, 2009

(30) Foreign Application Priority Data

Mar. 19, 2008   (KR) ................. 10-2008-0025452

(51) Int. Cl.
*G11C 8/08* (2006.01)
(52) U.S. Cl. ............................. 365/230.06
(58) Field of Classification Search .............. None
See application file for complete search history.

(56) References Cited

U.S. PATENT DOCUMENTS

| | | | | |
|---|---|---|---|---|
| 5,708,620 | A | * | 1/1998 | Jeong ................. 365/230.06 |
| 5,943,289 | A | * | 8/1999 | Ahn et al. ........... 365/230.06 |
| 6,069,838 | A | * | 5/2000 | Jeong ................. 365/230.06 |
| 7,027,351 | B2 | | 4/2006 | Lee et al. |
| 7,274,584 | B2 | | 9/2007 | Jung et al. |
| 2005/0169032 | A1 | * | 8/2005 | Higuchi ........................ 365/51 |

FOREIGN PATENT DOCUMENTS

| | | |
|---|---|---|
| KR | 1020060000686 A | 1/2006 |
| KR | 1020060087372 A | 8/2006 |

* cited by examiner

*Primary Examiner* — Hoai V Ho
*Assistant Examiner* — James G Norman
(74) *Attorney, Agent, or Firm* — Ladas & Parry LLP

(57) ABSTRACT

A semiconductor memory device includes a main word line shared by a plurality of mats. Each of the mats includes a plurality of sub word lines. A decoding unit is configured to decode a row address bit and output a word line driving signal. A plurality of sub word line driving units are each configured to activate one of the sub word lines according to the word line driving signal. In the semiconductor memory device each neighboring sub word line driving units is connected to a different main word line to remove parasitic coupling capacitance.

19 Claims, 4 Drawing Sheets

SEMICONDUCTOR MEMORY DEVICE REMOVING PARASITIC COUPLING CAPACITANCE BETWEEN WORD LINES

CROSS-REFERENCES TO RELATED APPLICATIONS

The present application is based upon and claims priority to Korean patent application number 10-2008-0025452 filed on 19 Mar. 2008, which is incorporated herein by reference in its entirety.

BACKGROUND OF THE INVENTION

The present invention relates generally to a semiconductor memory device, and more particularly, to a technology of removing parasitic coupling capacitance generated between word lines.

Recently, a vertical type cell transistor has been introduced to correspond to trend of technology miniaturization. When the vertical type cell transistor is used, the capacitance between word lines is increased resulting in defects in cell operation. The operation defects increase as the miniaturization of technology continues.

A cell transistor of over 100 nm has been used as a planar gate. In the cell transistor of over 100 nm operation of gate does not cause a fail in an adjacent gate. However, operation of an adjacent gate results in a fail in a conventional cell transistor of less than 100 nm using a recess gate.

The fail generated by the operation of an adjacent gate in the cell transistor of less than 100 nm using a recess gate can be sensed in a wafer level test. The frequency of the fail discussed above increases as the miniaturization of technology continues.

As the capacity and level of integration of semiconductor memory continue to increase, efforts to reduce chip size have also continued. Therefore, it is desirable to increase the number of net dies that can be produced in one wafer thereby improving cost competitiveness.

As such, it is important to develop a process technique and reduce the circuit critical dimension for this technology. Reduction of the critical dimension rapidly decreases the interval between signal lines. Capacitance between two conductive materials is inversely proportional to the interval, and therefore a reduction in the interval between signal lines results in an increase in the parasitic coupling capacitance between signals.

FIG. 1 is a diagram showing word line arrangement of a conventional semiconductor memory device. As shown in the FIG. 1, eight neighboring word lines are driven.

In general, a bank of a DRAM includes a cell mat, which is a group of cells for storing data of one bit. The whole capacity of a memory is determined depending on the arrangement and number of cell mats. The number of word lines and bit lines is determined by the whole capacity of memory.

The bank includes a plurality of sub word line driving units SWLD0~SWLD7 for driving sub word lines SWL0~SWL7. The sub word line driving units SWLD0_0~SWLD7_0 are connected to a main word line MWLB0. The sub word line driving units SWLD0_1~SWLD7_1 are connected to a main word line MWLB1.

The sub word line driving units SWLD0, SWLD2, SWLD4, and SWLD6 are arranged in an even column of the sub word line driving units SWLD0_0~SWLD7_0 and are driven by word line driving signals FX0, FX2, FX4, and FX6. The sub word line driving units SWLD1, SWLD3, SWLD5, and SWLD7 are arranged in an odd column of the sub word line driving units SWLD0_0~SWLD7_0 and are driven by word line driving signals FX1, FX3, FX5, and FX7.

The sub word lines SWL are driven in every active and precharge memory operation and are arranged in a narrow space in a cell mat. Due to this space restriction, coupling capacitance causes word lines to be inactivated by the activated neighboring word lines.

FIG. 2 is a circuit diagram illustrating the sub word line driving unit SWLD of FIG. 1.

The sub word line driving unit SWLD includes a PMOS transistor P1 and NMOS transistors N1, N2.

The PMOS transistor P1 is connected between a word line driving signal FX terminal and the sub word line SWL, and a gate of the PMOS transistor P1 is connected to the main word line MWLB. The NMOS transistor N1 is connected between the sub word line SWL and a ground voltage terminal, and a gate of the NMOS transistor N1 is connected to the main word line MWLB.

The NMOS transistor N2 is connected to the sub word line SWL and the ground voltage terminal, and a gate of the NMOS transistor N2 receives a word line driving signal FXB. The word line driving signal FXB is an inverted signal of the word line driving signal FX.

The PMOS transistor P1 and the NMOS transistor N1 have a common gate to receive a main word line MWLB signal having the same level. When the main word line MWLB signal is enabled to a low level, the PMOS transistor P1 is turned on. One sub word line SWL is activated according to the level of the word line driving signal FX, which is applied to the source of the PMOS transistor P1.

The adjacent word lines connected to the same main word line MWLB in the sub word line driving circuit increase a level of the sub word line by coupling capacitance. That is, when the PMOS transistor P1 is turned on in response to the main word line MWLB signal, a coupling capacitance is generated by the inactivation of the word line driving signal FX.

When one sub word line SWL is selected by the word line driving signal FX, the coupling capacitance affects a non-selected sub word line SWL in response to the main word line MWLB signal, enabled to the low level, because of the restricted space.

As a result, an undesired level increase may occur in a sub word line which should be inactivated. In this case, the amount of charges for preventing leakage current and securing data accuracy may be lost.

BRIEF SUMMARY OF THE INVENTION

Various embodiments of the present invention include arranging sub word lines in an interleave system to remove parasitic coupling capacitance generated between word lines, thereby preventing leakage current and data loss.

According to an embodiment of the present invention, a semiconductor memory device comprises: a main word line shared by a plurality of mats, each mat comprising p plurality of sub word lines; a decoding unit decode a row address bit to output a word line driving signal; and a plurality of sub word line driving units each configured to activate one of the sub word lines in response to the word line driving signal. A neighboring sub word line driving units of the plurality of sub word line driving units is connected to different main word line.

According to an embodiment of the present invention, a semiconductor memory device comprises: a first main word line; a second main word line; a first sub word line driving unit connected to the first main word line and driving a first sub word line according to a first word line driving signal; and a second sub word line driving unit connected to the second main word line and driving a second sub word line according to a second word line driving signal. The first sub word line driving unit is arranged adjacent to the second sub word line driving unit.

DESCRIPTION OF EMBODIMENTS

Figure 3:
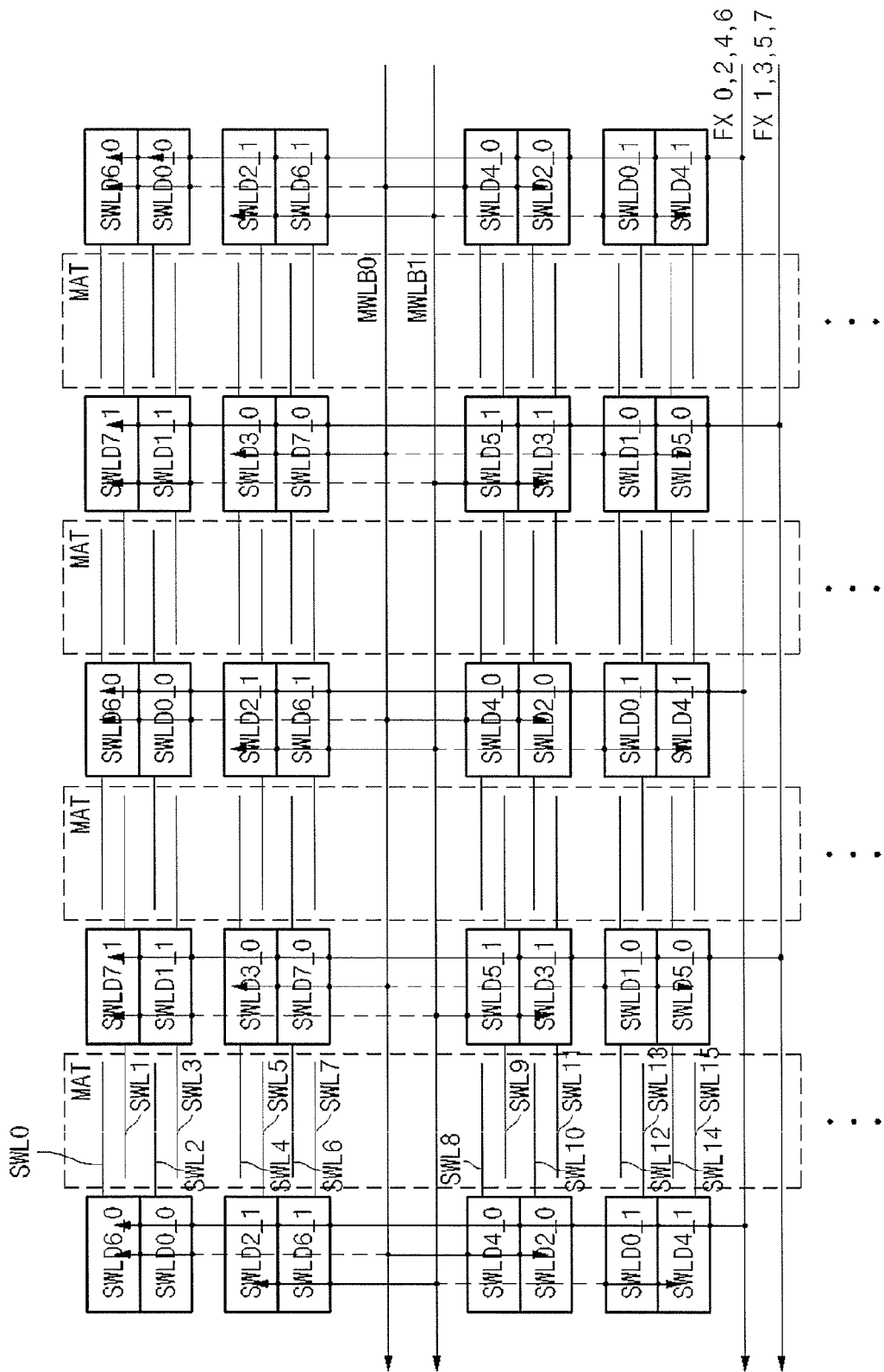
FIG. 3 is a diagram showing word line arrangement of a semiconductor memory device according to an embodiment of the present invention.

FIG. 3 is a diagram illustrating a word line arrangement of a semiconductor memory device according to an embodiment of the present invention.

The semiconductor memory device comprises a plurality of sub word line driving units SWLD0~SWLD7, main word lines MWLB0~MWLB1, and a plurality of sub word lines SWL0~SWL15 connected to mats.

The sub word line driving units SWLD are disposed between adjacent mats. One main word line MWLB is connected in common to a plurality of the mats. A pair of neighboring mats is shared by one sub word line SWL. The sub word line SWL is connected to a gate of a cell transistor (not shown).

The sub word line driving units SWLD are randomly decentralized and the main word lines MWLB are arranged in an interleaved (or banked) way to remove the parasitic coupling capacitance generated between the neighboring sub word lines, thereby preventing leakage current and data loss.

For example as shown in FIG. 3, the sub word line driving units SWLD6_0, SWLD0_0, SWLD2_1, and SWLD6_1 of the even sub word line driving units SWLD0, SWLD2, SWLD4, and SWLD6 are arranged in the same column.

The upper sub word line driving units SWLD6_0 and SWLD0_0 are connected to the main word line MWLB0. The notation "_0" of the sub word line driving unit SWLD indicates that the sub word line driving unit SWLD is connected to the main word line MWLB0.

The lower sub word line driving units SWLD2_1 and SWLD6_1 are connected to the main word line MWLB1. The notation "_1" of the sub word line driving unit SWLD indicates that the sub word line driving unit SWLD is connected to the main word line MWLB1.

Also, the sub word line driving units SWLD7_1, SWLD1_1 SWLD3_0, and SWLD7_0 of the odd sub word line driving units SWLD1, SWLD3, SWLD5, and SWLD7 are arranged in the same column.

The upper sub word line driving units SWLD7_1 and SWLD1_1 are connected to the main word line MWLB1. The notation "_1" of the sub word line driving unit SWLD indicates that the sub word line driving unit SWLD is connected to the main word line MWLB1.

The lower sub word line driving units SWLD3_0 and SWLD7_0 are connected to the main word line MWLB0. The notation "_0" of the sub word line driving unit SWLD indicates that the sub word line driving unit SWLD is connected to the main word line MWLB0.

Also, the sub word line driving units SWLD4_0, SWLD2_0, SWLD0_1, and SWLD4_1 of the even sub word line driving units SWLD0, SWLD2, SWLD4, and SWLD6 are arranged in the same column.

The upper sub word line driving units SWLD4_0 and SWLD2_0 are connected to the main word line MWLB0. The notation "_0" of the sub word line driving unit SWLD indicates that the sub word line driving unit SWLD is connected to the main word line MWLB0.

The lower sub word line driving units SWLD0_1 and SWLD4_1 are connected to the main word line MWLB1. The notation "_1" of the sub word line driving unit SWLD indicates that the sub word line driving unit SWLD is connected to the main word line MWLB1.

Also, the sub word line driving units SWLD5_1, SWLD3_1, SWLD1_0, and SWLD5_0 of the odd sub word line driving units SWLD1, SWLD3, SWLD5, and SWLD7 are arranged in the same column.

The upper sub word line driving units SWLD5_1 and SWLD3_1 are connected to the main word line MWLB1. The notation "_1" of the sub word line driving unit SWLD indicates that the sub word line driving unit SWLD is connected to the main word line MWLB1.

The lower sub word line driving units SWLD1_0 and SWLD5_0 are connected to the main word line MWLB0. The notation "_0" of the sub word line driving unit SWLD indicates that the sub word line driving unit SWLD is connected to the main word line MWLB0.

That is, sub word line driving units SWLD are connected to different main word lines MWLB than the sub word line driving units SWLD that are horizontally and vertically neighboring, respectively. The sub word line driving units SWLD are paired and connected to a main word line MWLB. Each pair of sub word line driving unit of the pair of sub word line driving units is connected to a different main word lines MWLB than the neighboring sub word line driving units SWLD.

For example, suppose that the sub word line SWL0 is activated according to the driving of the sub word line driving unit SWLD6_0 as shown in FIG. 3. In this case, the sub word line driving unit SWLD6_0 is connected to the main word line MWLB0. When the main word line MWLB0 is enabled to a low level, the sub word line SWL0 is activated by the word line driving signal FX6.

The sub word line driving unit SWLD7_1, adjacent to the sub word line driving unit SWLD6_0, is connected to the main word line MWLB1. The main word line MWLB1 is enabled to a high level because the sub word line driving unit SWLD7_1 is required to maintain an inactivated state. As a result, the neighboring sub word line SWL1 maintains the inactivated state in response to a non-selected word line driving signal FX7.

Figure 1:
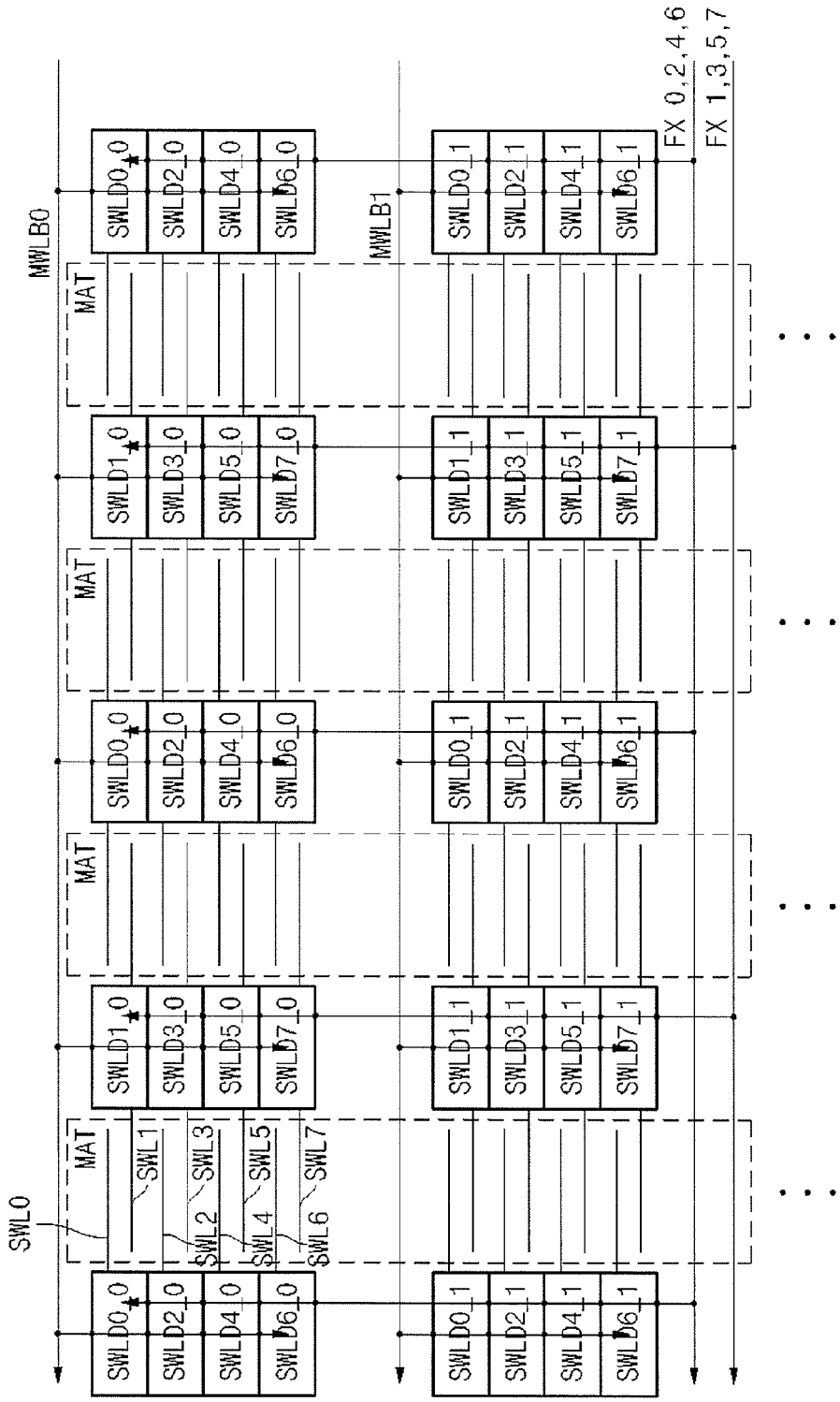
FIG. 1 is a diagram showing word line arrangement of a conventional semiconductor memory device.
Figure 2:
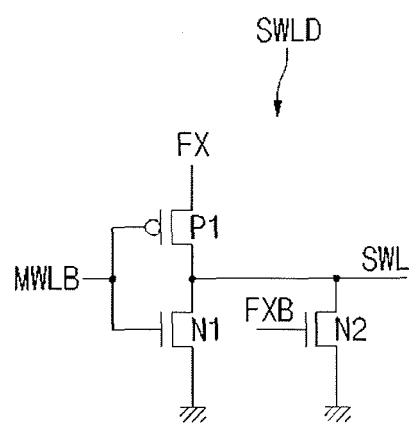
FIG. 2 is a circuit diagram showing a sub word line driving unit of FIG. 1.

The neighboring sub word line SWL1 is disabled to a low level through a pull-down MOS transistor (NMOS transistor N2 of FIG. 2). The neighboring sub word line SWL1 is not affected by the activated sub word line SWL0, and therefore voltage rise by coupling is inhibited.

When the sub word line driving units SWLD are interleaved, the sub word lines SWL may be arranged non-sequentially by decoding of row addresses (X-addresses).

Figure 4:
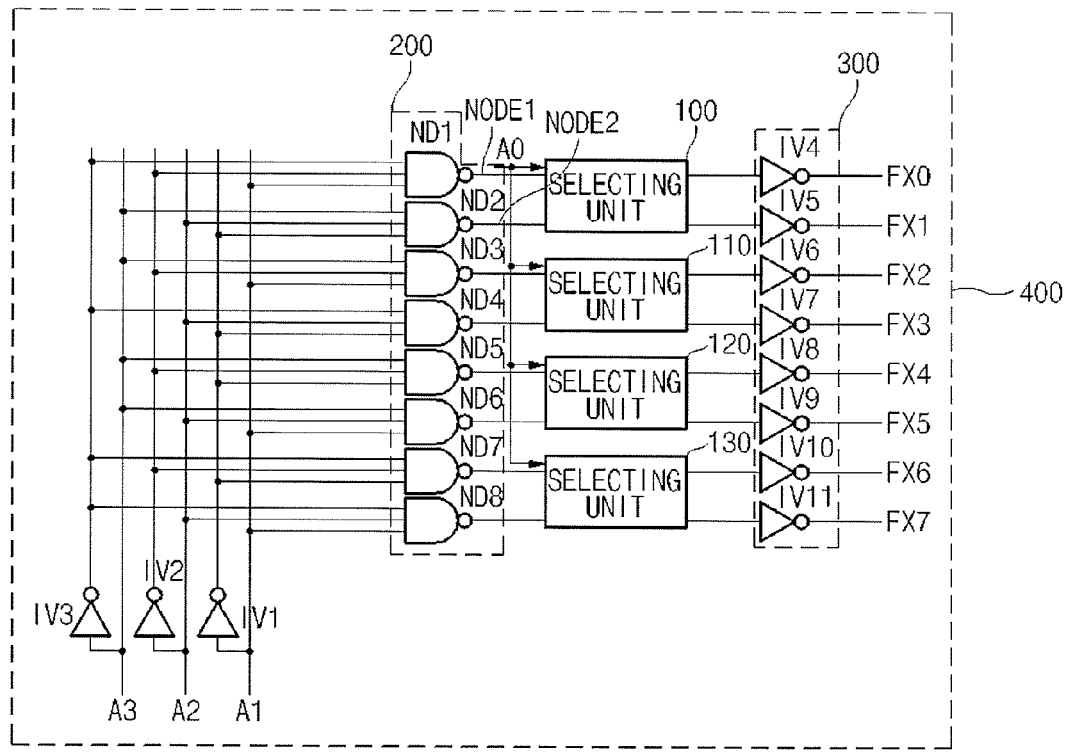
FIG. 4 is a circuit diagram showing a decoding unit configured to generate a word line driving signal FX of FIG. 3.

In order to prevent a non-sequential arrangement of the sub word lines, a semiconductor memory device according to an embodiment of the present invention comprises a decoding unit 400 configured to decode word line driving signals FX as shown in FIG. 4. The decoding unit 400 decodes word line driving signals FX that correspond to the decentralized sub word line driving units SWLD, so that the sub word lines SWL may be sequentially arranged.

The decoding unit 400 includes a plurality of inverters IV1~IV3, a logic operation unit 200 including a plurality of NAND gates ND1~ND8, a plurality of selecting units 100~130, and a driving unit 300 including a plurality of inverters IV4~IV11.

The NAND gate ND1 performs a logic NAND operation on a row address bit A1 and row address bits A2 and A3, which are inverted by the inverters IV2 and IV3. The NAND gate ND2 performs a logic NAND operation on the row address bit A1, inverted by the inverter IV1, and the row address bits A2 and A3.

The NAND gate ND3 performs a logic NAND operation on the row address bits A1 and A3 and the row address bit A2, which is inverted by the inverter IV2. The NAND gate ND4 performs a logic NAND operation on the row address bits A1 and A3, inverted by the inverters IV1 and IV3, and the row address bit A2.

The NAND gate ND5 performs a logic NAND operation on the row address bits A1 and A2, inverted by the inverters IV1 and IV2, and the row address bit A3. The NAND gate ND6 performs a logic NAND operation on the row address bits A1~A3.

The NAND gate ND7 performs a logic NAND operation on the row address bits A1~A3 inverted by the inverters IV1~IV3. The NAND gate ND8 performs a logic NAND operation on the row address bits A1 and A2 and the row address bit A3, which is inverted by the inverter IV3.

The selecting unit 100 selectively outputs signals the signals output by the NAND gates ND1 and ND2 according to the row address bit A0. The inverters IV4 and IV5 invert output signals of the selecting unit 100 to output word line driving signals FX0 and FX1.

The selecting unit 110 selectively outputs the signals output by the NAND gates ND3 and ND4 according to the row address bit A0. The inverters IV6 and IV7 invert output signals of the selecting unit 110 to output word line driving signals FX2 and FX3.

The selecting unit 120 selectively outputs the signals output by the NAND gates ND5 and ND6 according to the row address bit A0. The inverters IV8 and IV9 invert output signals of the selecting unit 120 to output word line driving signals FX4 and FX5.

The selecting unit 130 selectively outputs the signals output by the NAND gates ND7 and ND8 according to the row address bit A0. The inverters IV10 and IV11 invert output signals of the selecting unit 130 to output word line driving signals FX6 and FX7.

The value of the main word line MWLB signal is determined by decoding the row address bits A3~A8. The value of the word line driving signal FX is determined by decoding the row address bits A0~A3, each having a lower bit.

The sub word line driving units SWLD are paired and arranged adjacent to each other. Each sub word line driving unit SWLD of the paired sub word line driving units SWLD is coupled to the same main word line MWLB. According to an embodiment of the present invention, the sub word line driving units SWLD coupled to the same main word line MWLB signal are not arranged adjacent to each other, thereby preventing coupling capacitance.

The row address bit A3, corresponding to the lowest (least significant) bit of the row address bits A3~A8 that determine the main word line MWLB, is related to decoding of the word line driving signal FX.

That is, the three row address bits A1~A3 of the row address bits A0~A3 are decoded first. The selecting units 100~130 determine output depending on a high or low state of the row is address bit A0.

Figure 5:
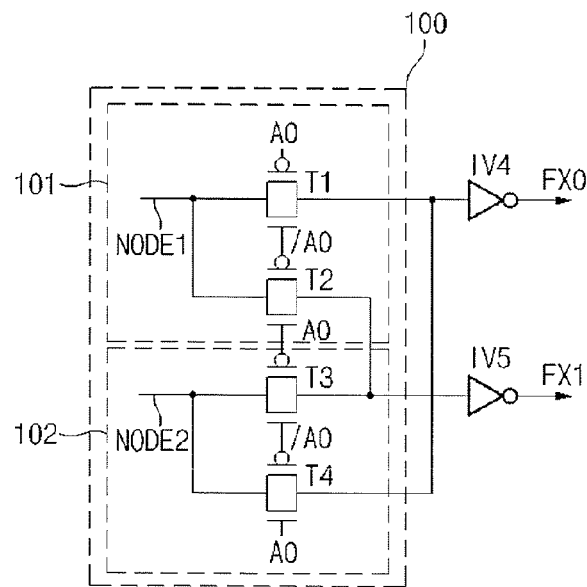
FIG. 5 is a circuit diagram showing a selecting unit of FIG. 4.

FIG. 5 is a circuit diagram showing the selecting unit 100 of FIG. 4. The selecting unit 100 includes a first selecting unit portion 101 comprising transmission gates T1~T2 and a second selecting unit portion 102 comprising transmission gates T3~T4.

The transmission gate T1 includes a PMOS transistor, and the gate of the PMOS transistor receives the row address bit A0. The transmission gate T1 also includes an NMOS transistor, and the gate of the NMOS transistor receives a row address bit/A0. The row address bit A0 has an opposite phase to that of the row address bit/A0. When the row address bit A0 is at a low level, a signal of the node NODE1 is outputted as the word line driving signal FX0.

The transmission gate T2 includes a PMOS transistor, and the gate of the PMOS transistor receives the row address bit/A0. The transmission gate T2 also includes an NMOS transistor, and the gate of the NMOS transistor receives the row address bit A0. When the row address bit A0 is at a high level, a signal of the node NODE1 is outputted as the word line driving signal FX1.

The transmission gate T3 includes a PMOS transistor, and the gate of the PMOS transistor receives the row address bit A0. The transmission gate T3 also includes an NMOS transistor, the gate of the NMOS transistor receives the row address bit/A0. When the row address bit A0 is at the low level, a signal of the node NODE2 is outputted as the word line driving signal FX1.

The transmission gate T4 includes a PMOS transistor, the gate of the PMOS transistor receives the row address bit/A0. The transmission gate T4 also includes an NMOS transistor, the gate of the NMOS transistor receives the row address bit A0. When the row address bit A0 is at the high level, a signal of the node NODE2 is outputted as the word line driving signal FX0.

That is, when the row address bit A0 is at the low level, the signal of the node NODE1 is outputted as the word line driving signal FX0, and the signal of the node NODE2 is outputted as the word line driving signal FX1. When the row address bit A0 is at the high level, the signal of the node NODE1 is outputted as the word line driving signal FX1, and the signal of the node NODE2 is outputted as the word line driving signal FX0.

In an embodiment, the main word lines MWLB are decentralized in an interleave way. Neighboring sub word lines SWL are controlled by different main word line MWLB signals to prevent coupling between the sub word lines SWL.

The decoding unit receives the row address bit A0 for decoding of the main word line MWLB signal. As a result, neighboring sub word lines SWL are controlled by different main word line MWLB signals depending on the row address bit A0. As such, increase in the level of neighboring sub word lines SWL due to coupling can prevented.

Table 1 is an activation truth table of the sub word line SWL depending on the row address bits A0~A3.

TABLE 1

| A3 | A2 | A1 | A0 | Enable MWLB | Enable EX | SWL |
|----|----|----|----|-------------|-----------|-----|
| 0 | 0 | 0 | 0 | MWLB<0> | FX6 | 0 |
| 0 | 0 | 0 | 1 | MWLB<1> | FX7 | 1 |
| 0 | 0 | 1 | 0 | MWLB<0> | FX0 | 2 |
| 0 | 0 | 1 | 1 | MWLB<1> | FX1 | 3 |

TABLE 1-continued

| A3 | A2 | A1 | A0 | Enable MWLB | Enable EX | SWL |
|----|----|----|----|-------------|-----------|-----|
| 0 | 1 | 0 | 0 | MWLB<0> | FX3 | 4 |
| 0 | 1 | 0 | 1 | MWLB<1> | FX2 | 5 |
| 0 | 1 | 1 | 0 | MWLB<0> | FX7 | 6 |
| 0 | 1 | 1 | 1 | MWLB<1> | FX6 | 7 |
| 1 | 0 | 0 | 0 | MWLB<0> | FX4 | 8 |
| 1 | 0 | 0 | 1 | MWLB<1> | FX5 | 9 |
| 1 | 0 | 1 | 0 | MWLB<0> | FX2 | 10 |
| 1 | 0 | 1 | 1 | MWLB<1> | FX3 | 11 |
| 1 | 1 | 0 | 0 | MWLB<0> | FX1 | 12 |
| 1 | 1 | 0 | 1 | MWLB<1> | FX0 | 13 |
| 1 | 1 | 1 | 0 | MWLB<0> | FX5 | 14 |
| 1 | 1 | 1 | 1 | MWLB<1> | FX4 | 15 |

For example, as shown in Table 1, when each row address bits A1~A3 is equal to "0", the signals output by each of the inverters IV1~IV3 are equal to "1". As a result, the signal output by the NAND gate ND7 is equal to "0", and the signal output by the NAND gate ND8 is equal to "1".

When the address A0 is equal to "0", the main word line MWLB<0> is activated. In this case, the transmission gates T1 and T3 are turned on. As a result, output signals of the NAND gates ND7 and ND8 are inputted into the inverters IV10 and IV11.

The word line driving signal FX6 is activated according to the output of the inverter IV10. When the word line driving signal FX6 is activated, the corresponding sub word line SWL0 is activated.

As described above, a semiconductor device according to an embodiment of the present invention eliminates parasitic coupling capacitance generated between word lines and therefore prevents leakage current and data loss even in an environment having a small critical dimension and a small space between signal lines of a fine process.

The above embodiments of the present invention are illustrative and not limitative. Various alternatives and equivalents are possible. The invention is not limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor memory device comprising:
   a plurality of main word lines shared by a plurality of mats, each mat comprising a plurality of sub word lines, wherein the plurality of sub word lines are sequentially arranged;
   a decoding unit decoding a row address bit to output a word line driving signal,
   a plurality of sub word line driving units each configured to activate one of the sub word lines in response to the word line driving signal, wherein the neighboring sub word lines of the plurality of sub word lines are non-sequentially activated so as to correspond with the word line driving signal, and
   wherein neighboring sub word line driving units of the plurality of sub word line driving units are connected to different main word lines,
   wherein even sub world line driving units of the plurality of sub word line driving units are arranged in the same column, and odd sub word line driving units of the plurality of sub word line driving units are arranged in the same column,
   wherein a notation of the plurality of sub word line driving units are not matched to a notation of the plurality of sub word lines connected to the plurality of sub word line driving units, respectively.

2. The semiconductor memory device according to claim 1, wherein the sub word line driving units are disposed in pairs and the sub word lines are arranged in an lattice pattern between the mats.

3. The semiconductor memory device according to claim 2, wherein paired sub word line driving units disposed to be adjacent to each other in a row direction are connected to different main word lines.

4. The semiconductor memory device according to claim 2, wherein paired sub word line driving units disposed to be adjacent to each other in a column direction are connected to different main word lines.

5. The semiconductor memory device according to claim 1, wherein the decoding unit comprises:
   a logic operation unit performing a logical operation on a plurality of row address bits;
   a plurality of selecting units, each selecting unit selectively controlling output signals of the logic operation unit according to a first row address bit; and
   a driving unit driving an output signal of the selecting unit and outputting a plurality of word line driving signals.

6. The semiconductor memory device according to claim 5, wherein the first row address bit has a lowest bit.

7. The semiconductor memory device according to claim 5, wherein the first row address bit is an address for selecting the main word line.

8. The semiconductor memory device according to claim 5, wherein the plurality of row address bits includes a second row address bit, a third row address bit, and a fourth row address bit having the lowest bit addresses except the first row address bit.

9. The semiconductor memory device according to claim 5, wherein each selecting unit comprises:
   a first selecting unit portion selectively outputting a first output signal received from the logic operation unit according to a logic state of the first row address bit; and
   a second selecting unit portion selectively outputting a second output signal received from the logic operation unit according to a logic state of the first row address bit.

10. The semiconductor memory device according to claim 9, wherein the first selecting unit portion comprises:
    a first transmission gate outputting the first output signal as a second word line driving signal in activation of the first row address bit; and
    a second transmission gate outputting the first output signal as a first word line driving signal in inactivation of the first row address bit.

11. The semiconductor memory device according to claim 9, wherein the second selecting unit comprises:
    a third transmission gate outputting the second output signal as the first word line driving signal in activation of the first row address bit; and
    a fourth transmission gate outputting the second output signal as the second word line driving signal in inactivation of the first row address bit.

12. A semiconductor memory device comprising:
    a first main word line;
    a second main word line;
       wherein the first main word line and the second main word line are shared by a plurality of mats;
    a first sub word line driving unit connected to the first main word line and driving a first sub word line according to a first word line driving signal; and a second sub word line driving unit connected to the second main word line and driving a second sub word line according to a second word line driving signal; and a decoding unit decoding a row address bit and outputting the first word line driving signal and the second word line driving signal, wherein the first sub word line driving unit is arranged adjacent to the second sub word line driving unit, and wherein the first sub word line and the second sub word line are sequentially arranged, the first sub word line and the second sub word line are non-sequentially activated, so as to correspond with the first word line driving signal and the second word line driving signal, wherein a notation of the first sub word line driving unit and a notation of the second sub word line driving unit are not matched to a notation of the first sub word line and a notation of the second sub word line connected to the first sub word line driving unit and the second sub word line driving unit, respectively.

13. The semiconductor memory device according to claim 12, wherein the decoding unit comprises:

a plurality of logic operation units performing a logical operation on a plurality of row address bits;

a plurality of selecting unit selectively controlling output signals of the logic operation unit according to a first row address bit; and a driving unit driving an output signal of the selecting unit and outputting a plurality of word line driving signals.

14. The semiconductor device according to claim 13, wherein the first row address bit has a lowest bit.

15. The semiconductor device according to claim 13, wherein the first row address bit is an address for selecting one of the first main word line and the second main word line.

16. The semiconductor device according to claim 13, wherein the plurality of row address bits includes a second row address bit, a third row address bit, and a fourth row address bit having the lowest bit addresses except the first row address bit.

17. The semiconductor memory device according to claim 13, wherein each selecting unit includes:

a first selecting unit portion selectively outputting a first output signal received from the logic operation unit according to a logic state of the first row address bit; and a second selecting unit portion selectively outputting a second output signal received from the logic operation unit according to a logic state of the first row address bit.

18. The semiconductor memory device according to claim 17, wherein the first selecting unit portion comprises:

a first transmission gate outputting the first output signal as a second word line driving signal in activation of the first row address bit; and a second transmission gate outputting the first output signal as a first word line driving signal in inactivation of the first row address bit.

19. The semiconductor memory device according to claim 17, wherein the second selecting unit portion includes:

a third transmission gate ting output the second output signal as the first word line driving signal in activation of the first row address bit; and a fourth transmission gate outputting the second output signal as the second word line driving signal in inactivation of the first row address bit.

* * * * *